United States Patent [19]

Moslehi

[11] Patent Number: 5,040,896
[45] Date of Patent: Aug. 20, 1991

[54] THREE-CRYSTAL TEMPERATURE-COMPENSATED REFERENCE INTERFEROMETER FOR SOURCE WAVELENGTH STABILIZATION

[76] Inventor: Behzad Moslehi, 724 N. Lucia Ave., Redondo Beach, Calif. 90277

[21] Appl. No.: 384,508

[22] Filed: Jul. 24, 1989

[51] Int. Cl.$^5$ .............................................. G01B 9/02
[52] U.S. Cl. .................................. 356/351; 356/345; 372/32
[58] Field of Search ...................... 356/350, 345, 351; 372/32; 350/400

[56] References Cited

U.S. PATENT DOCUMENTS

| | | | |
|---|---|---|---|
| 4,305,046 | 12/1981 | Le Floch et al. | 350/400 |
| 4,536,088 | 8/1985 | Rashleigh et al. | 356/351 |
| 4,842,358 | 6/1989 | Hall | 372/32 |
| 4,887,900 | 12/1989 | Hall | 372/32 |
| 4,890,922 | 1/1990 | Wilson | 356/350 |

*Primary Examiner*—Samuel Turner

[57] ABSTRACT

A method and apparatus for wavelength stabilization of an optical source uses three birefrigent crystals that are temperature-compensated as a whole to function as the two arms of a reference interferometer. Only phase differences resulting from shifts in the wavelength of the optical source are measured. Synchronous detection of a light intensity signal representative of the phase difference between light waves of orthogonal polarization is made possible by making one of the three crystals an electro-optic material and applying a modulating voltage to it. The remaining two crystals are a pair of different passive birefringent crystals. The three interferometer crystals are cut and polished to prescribed lengths and orientations; optical path length changes with temperature in one crystal are compensated for by opposite and equal optical path length changes in the other two. To maximize the sensitivity of the interferometer to variations in the source wavelength the three-crystal system is designed to function as a quarter-wave plate at the effective source emission wavelength. For a linearly polarized input lightwave at this wavelength with its polarization axis aligned at 45 degrees with respect to the crystal axes, the two component lightwaves having orthogonal polarizations suffer a phase difference of $\pi/2$ radians and the output light is circularly polarized. An analyzer with its axis aligned at 45 degrees with respect to the axis of the three-crystal quarter-wave plate passes a fraction of the light intensity incident on it which varies with deviations from the nominal source emissions wavelength. Changes in the light intensity passed by the analyzer are used to generate an error signal which is then converted to a control signal and fed back to the source to stabilize the emission wavelength.

34 Claims, 2 Drawing Sheets

THREE-CRYSTAL TEMPERATURE-COMPENSATED REFERENCE INTERFEROMETER FOR SOURCE WAVELENGTH STABILIZATION

BACKGROUND OF THE INVENTION

1. Field of the Invention

The invention relates generally to apparatus and methods for stabilizing the wavelength of light sources, and especially to the use of a temperature-compensated reference interferometer with one electro-optic crystal and two passive birefringent crystals to effect such stabilization.

2. Description of the Related Art

The phase velocity of a light wave having a given wavelength and traveling through a material medium is inversely proportional to the index of refraction of the medium at that wavelength. For certain materials the index of refraction depends on the polarization of a light wave propagating through them. Such materials are said to be "birefringent."

The property of birefringence can be distinguished as either passive or active. In passive birefringent crystals the birefringence is constant and cannot be varied by an external field, whereas in active birefringent crystals the application of an external field, such as an electric or magnetic field, can vary the birefringence in them. Examples of passively birefringent materials include monocrystalline silicon dioxide and magnesium fluoride. Examples of actively birefringent materials include monocrystalline lithium niobate and lithium tantalate; their birefringence can be varied by the application of an electric field.

A linearly polarized light wave can be thought of as consisting of two component waves having polarization vectors at right angles to each other in some reference coordinate plane. In traveling through a birefringent medium the two component waves will travel at different speeds because they encounter different refractive indices due to their different polarizations. After having propagated through a given path length the phases of the two component waves will be different because of their different speeds. If the phase difference is one-quarter of $2\pi$ radians, i.e., $\pi/2$ radians, the slab of material making up the path length is referred to as a "quarter-wave" plate.

Several configurations have been proposed for stabilizing the wavelength of superluminescent diodes (SLDs) utilized as the optical source in various applications, such as in fiberoptic gyroscopes. One of these configurations, based on two passive birefringent crystals (silicon dioxide and magnesium fluoride) for the reference interferometer and on dc detection, is disclosed in U.S. patent application Ser. No. 017,426 to Hall, filed Feb. 20, 1987, and now U.S. Pat. No. 4,842,358 and assigned to the assignee of the present invention. The disclosed method of stabilization suffers from the disadvantages of poor signal-to-noise ratio and low sensitivity due to dc detection. Another configuration is disclosed in U.S. patent application Ser. No. 017,425 to Wilson, filed Feb. 20, 1987, and now U.S. Pat. No. 4,890,922 and assigned to the assignee of the present invention. In the Wilson application two electro-optic crystals are used (lithium niobate and lithium tantalate) with a modulating signal applied to the crystals through electrodes for synchronous (ac) detection. This configuration has the disadvantage of requiring large modulating voltages as well as stringent fabrication tolerances. In synchronous detection a detection system is used which is sensitive only to signals at or near a given frequency or one of its harmonics, the frequency being the same as a modulating frequency applied to the electrodes of the active crystal. Synchronous detection obviates various noise and slow electronic drift problems. The passive pair of crystals is designed for temperature compensation and acts as the reference interferometer. Compensation of the reference interferometer for shifts in temperature insures that the phase differences being measured by the interferometer are due only to shifts in the wavelength of the optical source. This configuration of electro-optic and passively birefringent crystal pairs suffers from the disadvantages of requiring four crystals, with the two electro-optical crystals being necessarily of exactly the same length, which as a practical matter is extremely difficult to achieve. In addition, out of the four crystals only the two passive crystals are stabilized with temperature, so that the overall performance can be severely degraded if the electro-optic crystals are not exactly the same length.

The three patent applications referred to above are hereby incorporated by reference into the present application.

SUMMARY OF THE INVENTION

In accordance with the present invention, a method and apparatus for wavelength stabilization of an optical source uses three birefringent crystals that are temperature-compensated as a whole to function as the two arms of a reference interferometer. The three crystals are temperature-compensated as a whole so that only a shift in the wavelength of the optical source can result in a phase difference between light waves of orthogonal polarization propagating through the crystals. The methods and apparatus disclosed are based on synchronous detection of a light intensity signal representative of the phase difference between the light waves of orthogonal polarization. One of the three crystals is electro-optic, such as lithium niobate or lithium tantalate, with a modulating voltage applied to it to make synchronous detection possible. The remaining two crystals are a pair of different passive birefringent crystals such as silicon dioxide and magnesium fluoride.

The interferometer crystals are cut, polished, and arranged with prescribed lengths and orientations so that the phase changes with temperature in one crystal are compensated for by opposite and equal phase changes in the other two. The three crystals can be mounted on a common heat sink so that they are nominally at the same temperature. The temperature-compensated three-crystal system responds only to changes in the effective emission wavelength of the optical source.

The sensitivity of the interferometer to variations in the source wavelength is maximized by designing the three-crystal system to function as a quarter-wave plate at the effective source emission wavelength. For a linearly polarized input lightwave at this wavelength with its polarization axis aligned at 45 degrees with respect to the crystal axes, there will be a phase difference of $\pi/2$ between the two lightwaves having orthogonal polarizations. As a result the output light is circularly polarized.

An analyzer with its axis aligned at 45 degrees with respect to the axis of the three-crystal quarter-wave plate passes half the light intensity incident on it. For deviations from the nominal source emission wavelength the output state of polarization is either elliptical or linear, with a corresponding change in the light intensity passed by the analyzer.

Changes in the light intensity passed by the analyzer are used to generate an error signal indicative of the deviation from the desired output wavelength of the source. The error signal is converted to a control signal which is fed back to the source to stabilize the emission wavelength.

BRIEF DESCRIPTION OF THE DRAWINGS

The various features and advantages of the present invention are apparent in light of the following detailed description taken together with the accompanying drawing, in which.

DESCRIPTION OF THE PREFERRED EMBODIMENT

Figure 1:
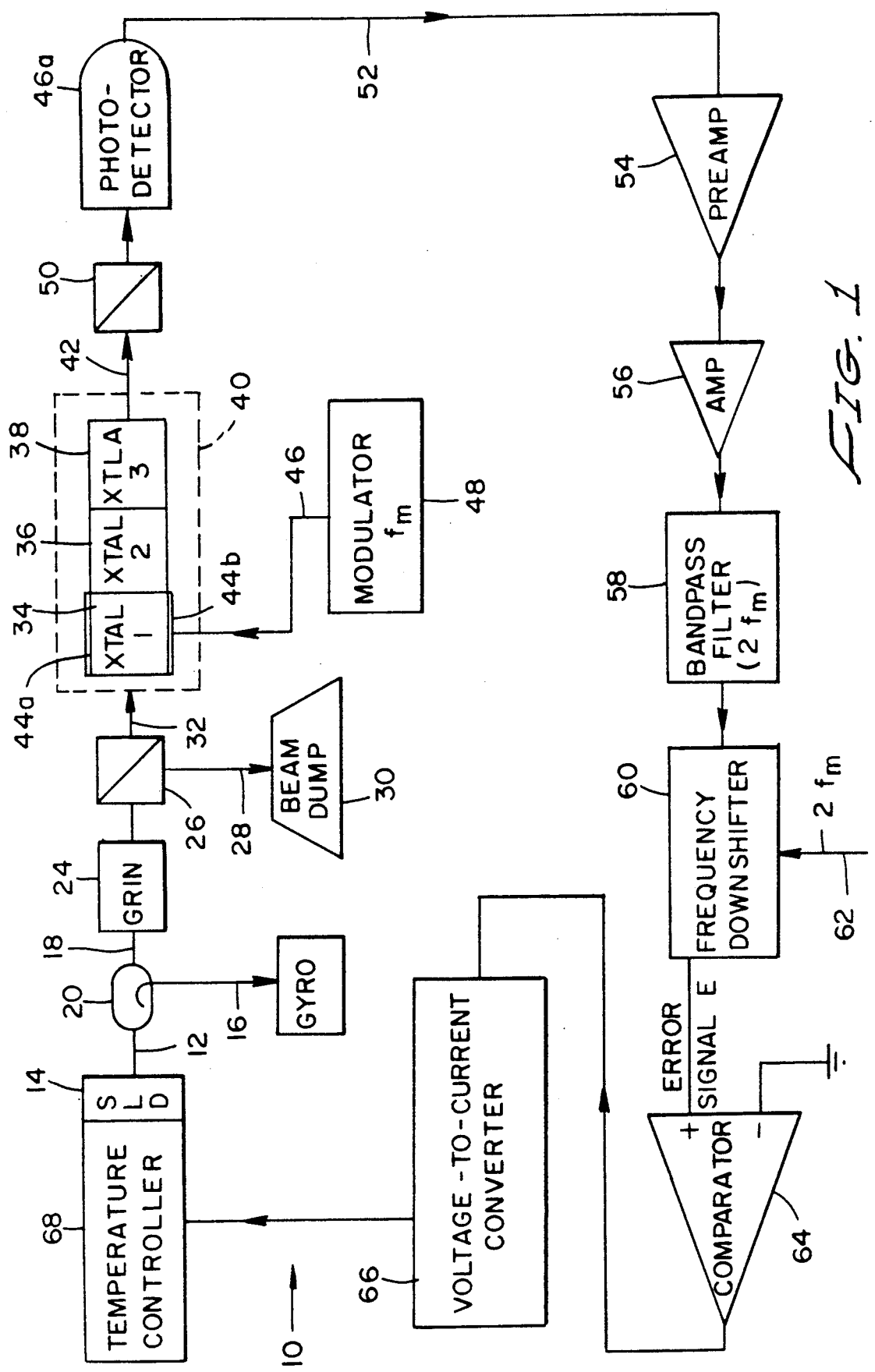
FIG. 1 is a schematic block diagram of a temperature-compensated three-crystal light source wavelength stabilization apparatus in accordance with the invention.

FIG. 1 shows, in schematic form, a temperature-compensated three-crystal light source wavelength stabilization apparatus 10 in accordance with the invention.

Referring to FIG. 1, a polarization-maintaining fiber (PMF) 12 is connected to a superluminescent diode (SLD) source 14. Light from polarization-maintaining fiber (PMF) 12 is divided into two paths 16 and 18 by a fiber coupler 20. Light traveling along path 16 energizes, for example, a rotation-sensing gyro, while light traveling along path 18 is collimated by a quarter-pitch graded-index (GRIN) lens 24 for the wavelength of the source 14 and subsequently polarized by a polarizer 26. As shown in FIG. 1, polarizer 26 is preferably a polarizing beamsplitter because the extinction ratio for the unpassed polarization states is better than other devices which produce an output beam of linearly polarized light when an input beam of randomly polarized or partially polarized light is incident on them.

A reflected light beam 28 is dumped into a beam dump 30, while a transmitted light beam 32 is polarized linearly by polarizing beamsplitter 26 at a 45-degree orientation with respect to the crystal axes of first, second, and third crystals 34, 36, and 38, respectively, which together make up a thermally-compensated reference interferometer 40.

The parameters of the crystals 34, 36, and 38 (length, index, and orientation) are chosen in such a way that the combination of all three crystals as a whole is stabilized with temperature at least to first order. The net optical path length difference (OPD) does not vary with temperature, therefore the state of polarization of light in the output beam 42 of the crystals is a function only of the source wavelength.

One of the crystals (shown in FIG. 1 as the first crystal) is an electro-optic crystal with electrodes 44a and 44b on opposite surfaces. A modulating signal 46 from a modulation signal source 48 is applied to electrodes 44a and 44b. The other two crystals which are part of thermally-compensated reference interferometer 40 are passive birefringent crystals.

An output polarization analyzer 50 has its axis oriented at 45 degrees with respect to the crystal axes of crystals 34, 36, and 38. Polarization analyzer 50 converts changes in the state of polarization of the light passing through it to intensity changes which are detected by a photodetector 46. The output 52 of photodetector 46 is amplified first by preamplifier 54 and then by amplifier 56.

The error signal at the photodetector 46 is in the passband of filter 58 (ac detection). The synchronously detecting servo loop constantly forces the error signal to zero. The output signal from bandpass filter 58 goes to frequency downshifter 60, which has a second input 62 with an input signal at a frequency of $2f_m$. The output error signal $\epsilon$ from frequency downshifter 60 goes to one input of a comparator 64 whose other input is grounded.

The output of comparator 64 is processed by voltage-to-current converter 66. Converter 60 has an output which is fed back to a temperature control unit 68, such as a Peltier thermo-electric device, connected to light source 14 to control the emission wavelength.

Figure 2:
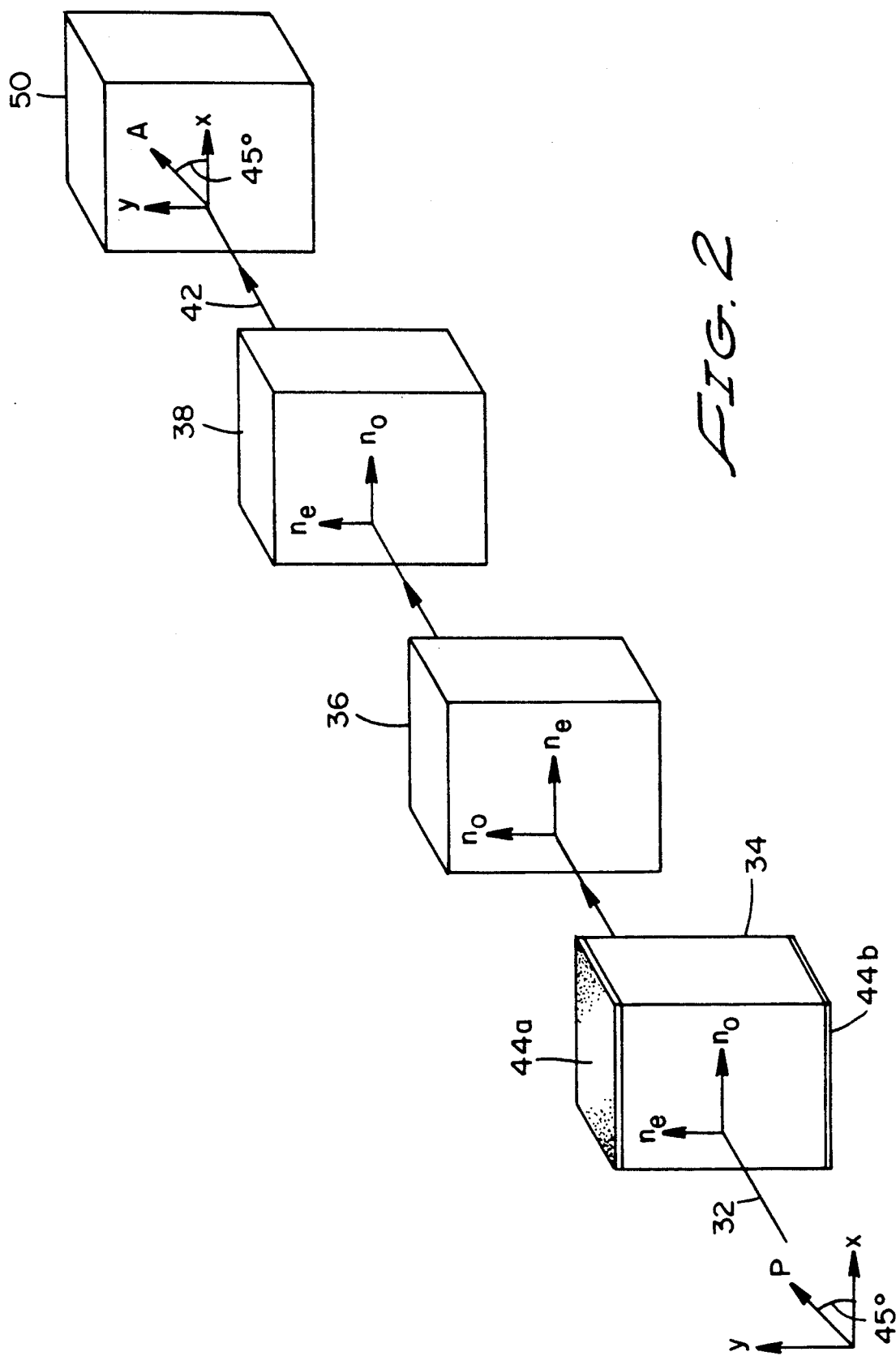
FIG. 2 is a schematic perspective view of the three-crystal reference interferometer showing the relative orientations of the input light polarization vector P, the crystal axes, and the axis A of the polarization analyzer.

As shown in FIG. 2, at the input to the crystals 34, 36, and 38 the linearly polarized input light has its axis of polarization oriented at 45 degrees with respect to the axes of the three crystals. The input polarized light is decomposed into two components called the "ordinary" (o) and "extraordinary" (e) rays, which travel at different velocities because they encounter different refractive indices $n_o$ and $n_e$, respectively. At the output of the crystals 34, 36, and 38 the components of the total phase (excluding the source random phase) of the light field along the x and y axes are given by $$\Phi_y = K_{e1} \sin 2\pi f_m t + \phi_{e1} + \phi_{o2} + \phi_{e3} \tag{1}$$

$$\Phi_x = K_{o1} \sin 2\pi f_m t + \phi_{o1} + \phi_{e2} + \phi_{o3} \tag{2}$$

where $K_{e1}$ and $K_{o1}$ are phase modulation amplitudes (functions of applied voltage) and $\phi_{ei}$ and $\phi_{oi}$ (i=1,2,3) are the dc (bias) phases of the extraordinary and ordinary rays, respectively, which are in turn given by $$\phi_{ei} = k n_{ei} l_i, i = 1,2,3 \tag{3}$$

$$\phi_{oi} = k n_{oi} l_i, i = 1,2,3 \tag{4}$$

with $k = 2\pi/\lambda$ being the vacuum k-vector, $n_{ei}$ and $n_{oi}$ the extraordinary and ordinary refractive indices of the $i^{th}$ crystal, and $l_i$ the physical length of the $i^{th}$ crystal. Using the definition $\Delta K_1 = K_{e1} - K_{o1}$, the net phase difference can be obtained from Equations (1) and (2):

$$\Delta \Phi = \Phi_x - \Phi_y = \Delta K_1 \sin 2\pi f_m t + (\phi_{o1} - \phi_{e1}) + (\phi_{e2} - \phi_{o2}) + (\phi_{o3} - \phi_{e3}) \tag{5a}$$

where $$(\phi_{o1} - \phi_{e1}) + (\phi_{e2} - \phi_{o2}) + (\phi_{o3} - \phi_{e3}) = \Delta \Phi_{dc} = (2\pi/\lambda_o)[(N + \tfrac{1}{4})(\lambda_o + \epsilon)], \tag{5b}$$

with N being an integer and $\epsilon$ representing the deviation of the source wavelength from the center wavelength $\lambda_o$. Note that $\Delta \Phi_{dc}$ varies with the wavelength of the light source.

The detected light intensity is given by $$I_{out}(t) = \tfrac{1}{2}I_o[1 + V\cos\Delta\Phi] \qquad (6)$$
$$= \tfrac{1}{2}I_o[1 + V\cos(\Delta K_1 \sin 2\pi f_m t + 2\pi N + (\pi/2) + (2\pi/\lambda_o)\epsilon)]$$
$$= \tfrac{1}{2}I_o[1 + V\sin(\Delta K_1 \sin 2\pi f_m t + (2\pi/\lambda_o)\epsilon)]$$

where $I_o$ is the average intensity of the lightwave and $V$ is the visibility. The output contains a dc term as well as frequency components at integer multiples of the modulating frequency $f_m$. The modulation frequency is chosen to be above the highest frequency component of the wavelength fluctuations of the source within the detection band. At $f_m$ and $2f_m$ the signal magnitudes are given by $$I(f_m) = \tfrac{1}{2}I_o V\cos[(2\pi/\lambda_o)\epsilon]\sin[\Delta K_1 \sin 2\pi f_m t]\big|_{1st\ harmonic} \qquad (7)$$
$$= I_o V\cos[(2\pi/\lambda_o)\epsilon]J_1(\Delta K_1)\sin 2\pi f_m t$$

and $$I(2f_m) = \tfrac{1}{2}I_o V\sin[(2\pi/\lambda_o)\epsilon]\cos[\Delta K_1 \sin 2\pi f_m t]\big|_{2nd\ harmonic} \qquad (8)$$
$$= I_o V\sin[(2\pi/\lambda_o)\epsilon]J_2(\Delta K_1)\sin 4\pi f_m t \approx$$
$$I_o V(2\pi/\lambda_o)\epsilon]J_2(\Delta K_1)\sin 4\pi f_m t$$
for $\epsilon/\lambda_o << 1$ where $J_1(\Delta K_1)$ and $J_2(\Delta K_1)$ are first-order and second-order Bessel functions. The synchronously detecting servo loop constantly forces the above error signal, $I(2f_m)$, to zero. From Equation (8) it can be seen that the error signal is centered around the frequency $2f_m$ and is scaled by $J_2(\Delta K_1)$.

The crystals 34, 36, and 38 can be advantageously mounted on a heat sink to reduce the thermal load on temperature control unit 68.

Calculation of Optimum Crystal Thickness Ratios/Design Formulas

The dc bias point of the interferometer can be written as $$\Delta\Phi_{dc}(T,\lambda) = (2\pi/\lambda)[B_1(T)l_1(T) - B_2(T)l_2(T) + B_3(T)l_3(T)] \qquad (9)$$

where $B_i (i=1,2,3)$ denotes the birefringence of the $i^{th}$ crystal, $T$ represents the temperature, $\lambda$ the optical wavelength in vacuum, and $l_i$ the length of the $i^{th}$ crystal. It has been assumed that the birefringences are independent of wavelength within the wavelength range of interest. For a temperature insensitive interferometer the derivative of the phase difference $\Delta\Phi_{dc}$ with respect to temperature $T$ must be zero. That is, $$\partial\Delta\Phi_{dc}(T,\lambda)/\partial T = 0 \qquad (10)$$

Combining Equations (9) and (10) results in $$\partial\Delta\Phi_{dc}(T,\lambda)/\partial T = (2\pi/\lambda)[B_1(\partial l_1/\partial T) + l_1(\partial B_1/\partial T) - \qquad (11)$$
$$B_2(\partial l_2/\partial T) - l_2(\partial B_2/\partial T) + B_3(\partial l_3/\partial T) + l_3(\partial B_3/\partial T)]$$
$$= (2\pi/\lambda)[B_1\alpha_1 l_1 + l_1(\partial B_1/\partial T) - B_2\alpha_2 l_2 -$$
$$l_2(\partial B_2/\partial T) + B_3\alpha_3 l_3 + l_3(\partial B_3/\partial T)]$$
$$= (2\pi/\lambda)[B_1 l_1(B_1^{-1}(\partial B_1/\partial T) + \alpha_1) -$$

-continued
$$B_2 l_2(B_2^{-1}(\partial B_2/\partial T) + \alpha_2) + B_3 l_3(B_3^{-1}(\partial B_3/\partial T) + \alpha_3)]$$
$$= (2\pi/\lambda)[B_1 l_1 K_1 - B_2 l_2 K_2 - B_3 l_3 K_3] \equiv 0$$

where the definition
$$K_i \equiv B_i^{-1}(\partial B_i/\partial T) + \alpha_i \text{ for } i=1,2,3 \qquad (12)$$

has been made, with $\alpha_i$ being the thermal expansion coefficient of the $i^{th}$ crystal. From Equation (11) it follows that $$B_1 l_1 K_1 - B_2 l_2 K_2 B_3 l_3 K_3 = 0 \qquad (13)$$

Dividing both sides of Equation (13) by $B_1 l_1 K_1$ gives $$1 - [(B_2 K_2)/(B_1 K_1)](l_2/l_1) + [(B_3 K_3)/(B_1 K_1)](l_3/l_1) = 0 \qquad (14)$$

The $B_i$ and $K_i$ are constants for the crystals 34, 36, and 38 used in the interferometer 40. Equation (14) determines the two length ratios $l_2/l_1$ and $l_3/l_1$. Another consideration is that the net optical path difference must be shorter than the coherence length in the material of the light from the source 14 in order to get an interference effect. That is, $$|B_1 l_1 - B_2 l_2 + B_3 l_3| < L_c \qquad (15)$$

where $L_c$ is the coherence length. For complete temperature compensation the temperature dependence of the electro-optic coefficients of the electro-optical crystals must also be considered. Thus, for an electro-optical crystal $$K_{EO} = B^{-1}(dB/dT) + \alpha \qquad (16)$$
$$= B^{-1}(dB_o/dT + \beta E(dr_{ij}/dT)) + \alpha$$
$$= B^{-1}((dB_o/dT) + \alpha + (B - B_o)(r_{ij}^{-1}(\partial r_{ij}/\partial T))$$

where $\beta$ is a constant set by the index of refraction and $r_{ij}$ is the electro-optic coefficient. Again the value for $r_{ij}^{-1}(\partial r_{ij}/\partial T)$ is a property of the material and is constant. For example, for lithium niobate this value is $r_{33}^{-1}(\partial r_{33}/\partial T) = 4.9 \times 10^{-4}$°/C. Thus, $l_1$, $l_2$, and $l_3$ are chosen so that Equations (14) and (15) are satisfied simultaneously.

The above-described embodiments are furnished as illustrative of the principles of the invention, and are not intended to define the only embodiment possible in accordance with our teaching. For example, optical source 14 could be a laser diode instead of a superluminescent diode. Alternatively, optical source 14 could be a gas laser, in which case the emission wavelength could be controlled by a feedback controller which altered the cavity length of the laser instead of its temperature. Rather, the invention is to be considered as encompassing not only the specific embodiments shown, but also any others falling within the scope of the following claims.

What is claimed is:

1. An optical interferometer including first and second optical paths through first, second, and third birefringent materials, said paths having first and second associated optical path lengths, respectively, for first and second lightwaves having orthogonal polarization states, said first and second associated optical path lengths and the resulting phase shift differing by an amount which is substantially invariant under changes in temperature and said phase shift corresponding to said optical path length difference changing substantially only with a change in wavelength of said lightwaves.

2. The optical interferometer of claim 1 comprising:
a first birefringent material having a first thickness and orientation;
a second birefringent material positioned adjacent said first birefringent material so that a light beam passing through said first material passes also through said second material, said second material having a second thickness and orientation;
a third birefringent material positioned adjacent said second birefringent material so that said light beam passes also through said third material, said third material having a third thickness and orientation; and
means for modulating the birefringence of said first birefringent material;
wherein said first, second, and third birefringent materials are temperature compensated as a whole by choosing said materials and said thickness thereof so that optical path length changes with temperature in one said material for first and second lightwaves having polarizations at right angles to each other and to a direction of propagation of said lightwaves are compensated for by opposite and equal optical path length changes for said first and second lightwaves in the other two said materials.

3. The optical interferometer of claim 2 wherein said first birefringent material comprises an electro-optic crystal and said second and third birefringent materials comprise different passive birefringent materials.

4. The optical interferometer of claim 2 wherein said first and second birefringent materials comprise different passive birefringent materials and said third birefringent material comprises an electro-optic crystal.

5. The apparatus of claim 2 wherein said first birefringent material comprises $MgF_2$ and said second birefringent material comprises $SiO_2$.

6. The apparatus of claim 2 wherein said first birefringent material comprises $LiNbO_3$.

7. The apparatus of claim 2 wherein said first birefringent material comprises $LiNbO_3$.

8. Apparatus for stabilizing the wavelength of an optical source, said source supplying a beam of light along a light path having a beginning and an end, and said source being disposed so that said beam enters said light path at said beginning, comprising:
polarizing means for polarizing a first portion of a light beam incident thereon, and for deflecting a second portion of said light beam incident thereon, said polarizing means being disposed at said beginning of said light path;
temperature-invariant path-length-difference means for providing first and second optical paths having first and second associated optical path lengths for first and second lightwaves having orthogonal polarization states, said first and second associated optical path lengths differing by an amount which is substantially invariant under changes in temperature, said path-length-difference means forming part of said light path, and on which said second portion of said light beam is incident, said temperature-invariant path-length-difference means comprising electro-optic means for electro-optically altering a refractive index of first and second segments of said first and second optical paths, respectively, disposed in said light path between said polarizing means and said polarization analyzing means; first birefringent means for splitting a light beam incident thereon into two beams travelling at different velocities according to their polarization states, disposed in said light path adjacent said electro-optic means; and second birefringent means for splitting a light beam incident thereon into two beams travelling at different velocities according to their polarization states, disposed in said light path adjacent said first birefringent means;
polarization analyzing means for analyzing the polarization state of a light beam incident thereon, disposed at said end of said light path;
detection means for detecting an output light beam exiting from said end of said light path, disposed at a position to intercept said exiting light beam;
error signal production means for producing a wavelength error signal in response to said output light beam exiting from said end of said light path, operatively connected to said detection means and having an output; and
optical source feedback control means for producing a feedback control signal in response to said wavelength error signal, operatively connected to said optical source means, and having an input connected to said output of said error signal production means;
wherein a wavelength of said beam of light supplied by said optical source means is kept substantially constant by said feedback control signal.

9. The apparatus of claim 8 further comprising:
modulation means for modulating said second portion of said light beam at a predetermined frequency, operatively connected to said temperature-invariant path-length-difference means; and
synchronous detection means for synchronously detecting said output light beam at said predetermined frequency, said synchronous detection means forming part of said detection means.

10. The apparatus of claim 8 wherein said electro-optic means comprises an electro-optic crystal.

11. The apparatus of claim 8 wherein said first birefringent means comprises a passive birefringent crystal and said second birefringent means comprises a passive birefringent crystal.

12. The apparatus of claim 11 wherein a material, a thickness, and an orientation for said electro-optic means, for said first passive birefringent means, and for said second passive birefringent means are chosen so that a difference in optical path lengths traveled by said first and second lightwaves and the resulting phase shift in said means is substantially invariant under temperature changes, and said phase shift corresponding to said optical path length difference changes only because of changes in said output wavelength of said optical source.

13. The apparatus of claim 11 wherein said first passive birefringent crystal comprises $MgF_2$, and said second passive birefringent crystal comprises $SiO_2$.

14. The apparatus of claim 11 wherein said electro-optic means comprises $LiNbO_3$.

15. The apparatus of claim 11 wherein said electro-optic means comprises $LiNbO_3$.

16. The apparatus of claim 11 wherein said electro-optic means, said first passive birefringent means, and said second passive birefringent means comprise a quarter-wave plate at a nominal operating wavelength of said optical source means, said quarter-wave plate having an associated axis.

17. The apparatus of claim 11 wherein said polarizer produces a linearly polarized light beam, and a direction of polarization of said linearly polarized light beam makes an angle of about 45 degrees with respect to said axis of said quarter-wave plate.

18. The apparatus of claim 8 wherein said optical source means comprises a superluminescent diode with a coherence length greater than said difference in optical path lengths.

19. The apparatus of claim 8 wherein said optical source means comprises a single-mode laser.

20. The apparatus of claim 8 wherein said optical source means comprises a multimode laser.

21. The apparatus of claim 8 wherein an axis of said polarization analyzing means is oriented at about 45 degrees with respect to said direction of polarization of said linearly polarized light beam.

22. The apparatus of claim 8 wherein said polarization analyzing means comprises a quarter-wave plate at a nominal operating wavelength of said optical source means.

23. The apparatus of claim 8 wherein said polarization analyzing means comprises a sheet of polarizing material.

24. Apparatus for stabilizing the wavelength of an optical source, comprising:
   optical source means for supplying a beam of light along a light path having a beginning and an end, said source means being disposed so that said beam enters said path at said beginning;
   electro-optic means for electro-optically altering the refractive index of a segment of a first associated optical path length for a first lightwave having a first polarization state, and of a segment of a second associated optical path length for a second lightwave having a polarization state orthogonal to said first polarization state, disposed in said light path;
   polarizing means for polarizing and transmitting a first portion of a light beam incident thereon, and for deflecting a second portion of said light beam incident thereon, disposed at said beginning of said light path;
   polarization analyzing means for analyzing the polarization state of a light beam incident thereon, disposed at said end of said light path;
   detection means for detecting an output light beam exiting from said end of said light path, disposed adjacent said analyzing means to accept said output beam;
   first birefringent means for causing components of an incident light beam having orthogonal polarizations to travel at different velocities according to their polarization states, disposed in said light path between said polarizing means and said polarization analyzing means adjacent said electro-optic means;
   second birefringent means for causing components of an incident light beam having orthogonal polarizations to travel at different velocities according to their polarization states, disposed in said light path between said first polarizing means and said polarization analyzer means adjacent said first birefringent means;
   error signal production means for producing a wavelength error signal in response to said output light beam exiting from said end of said light path, said error signal production means being operatively connected to said detector means and having an output; and
   optical source feedback control means for producing a feedback control signal in response to said wavelength error signal, operatively connected to said optical source means, and having an input connected to said output of said error signal production means;
   wherein said electro-optic means and said first and second birefringent means form first and second overall optical path lengths for lightwaves of orthogonal polarizations, said path lengths differing by a substantially invariant amount as temperature changes;
   and wherein a wavelength of said beam of light supplied by said optical source means is kept substantially constant by said feedback control signal.

25. The apparatus of claim 24 further comprising:
   modulation means for modulating said first and second lightwaves at a predetermined frequency, operatively connected to said electro-optic means; and
   synchronous detection means for synchronously detecting said output light beam at said predetermined frequency, said synchronous detection means forming part of said detection means.

26. The apparatus of claim 24 wherein said electro-optic means comprises an electro-optic crystal, said first birefringent means comprises a passive birefringent crystal, and said second birefringent means comprises a passive birefringent crystal.

27. The apparatus of claim 24 wherein a material, a thickness, and an orientation for said electro-optic means, for said first birefringent means, and for said second passive birefringent means are chosen so that said first and second overall optical path lengths and the resulting phase shift for lightwaves of orthogonal polarizations differ by an amount which is substantially invariant under temperature changes, and said amount of resulting phase shift changes only because of changes in said output wavelength of said optical source.

28. The apparatus of claim 27 wherein said first birefringent means comprises $MgF_2$ and said second passive birefringent means comprises $SiO_2$.

29. The apparatus of claim 27 wherein said electro-optic means comprises $LiNbO_3$.

30. The apparatus of claim 27 wherein said electro-optic means comprises $LiTaO_3$.

31. An optical reference interferometer having first and second optical paths with associated overall optical path lengths for first and second lightwaves having orthogonal polarization states, comprising:
   polarizing means for linearly polarizing a light wave incident on said interferometer, disposed in a path of said light wave;
   polarization analyzing means for analyzing the polarization of a light beam exiting said interferometer, disposed in a position to intercept said exiting light beam;
   an electro-optic crystal disposed in a light path between said polarizing means and said polarization analyzing means;
   modulation means for supplying a time-dependent electric potential difference across said electro-optic crystal, operatively connected to said electro-optic crystal;

a first passive birefringent crystal disposed in said light path adjacent said electro-optic crystal; and a second passive birefringent crystal disposed in said light path adjacent said first birefringent crystal.

32. The reference interferometer of claim 31 wherein a material, a thickness and an orientation for said electro-optic crystal, for said first passive birefringent crystal, and for said second passive birefringent crystal are chosen so that said first and second overall optical path lengths and the resulting phase shift of said interferometer for lightwaves of orthogonal polarizations differ by an amount which is substantially invariant under temperature changes, and said amount of resulting phase shift changes only because of changes in said output wavelength of said optical source.

33. A method of stabilizing the output wavelength of an optical source using the reference interferometer of claim 31, comprising:

splitting a light beam from said optical source into a linearly polarized light beam and a deflected beam;

introducing said linearly polarized light beam into said interferometer so that first and second lightwaves propagate along said first and second path, respectively;

supplying a modulated periodic potential difference at a predetermined frequency to said electro-optic crystal;

analyzing the polarization states of said first and second lightwaves after they have passed through said first and second passive birefringent crystals in a way which allows said lightwaves to interfere with each other in an output light beam;

synchronously detecting, at said predetermined frequency, an intensity of said output light beam;

producing an error signal derived from said output light beam intensity;

providing said error signal to an input of a feedback control signal generation means and generating a feedback control signal; and applying said feedback control signal to an input of said optical source to stabilize the wavelength of said source;

wherein a material, a thickness, and an orientation for said electro-optic crystal, for said first passive birefringent crystal, and for said second passive birefringent crystal have been chosen such that said first and second overall optical path lengths and the resulting phase shift of said second interferometer for lightwaves of orthogonal polarization differ by an amount which is substantially invariant under temperature changes, and said amount of resulting phase shift changes only because of changes in said output wavelength of said optical source;

and wherein said error signal derived from said output light beam intensity is representative of changes in light intensity due to changes in said source wavelength and not to changes in temperature.

34. A method of stabilizing the output wavelength of an optical source using the apparatus of claim 8, comprising:

supplying a beam of light from said source to said light path of said apparatus;

linearly polarizing and transmitting along said light path a first portion of said beam of light and deflecting a second portion of said beam of light out of said light path, to produce a linearly polarized transmitted light beam and a deflected beam;

periodically altering the refractive indices for lightwaves of orthogonal polarization of a first segment of said light path with a predetermined frequency;

splitting said linearly polarized transmitted light beam into two beams traveling at different velocities according to their polarization states by allowing said linearly polarized transmitted light beam to travel though said first segment of said light path;

recombining said two beams into a combined light beam having a first component with a first phase and a second component with a second phase, said components traveling at different velocities before said analyzing means but having identical polarization states after said analyzing means;

analyzing the polarization states of said combined light beam to produce a polarization-analyzed light beam with two interfering components having the same polarization state;

detecting, at a harmonic of said predetermined frequency, a light intensity resulting from interference of said polarization-analyzed light beam components exiting from said light path;

producing a wavelength error signal in response to changes in said light intensity;

producing a feedback control signal in response to said wavelength error signal; and applying said feedback control signal to means for controlling the wavelength of said optical source means;

wherein a difference between said first and second phases remains the same if said output wavelength of said optical source remains the same, but changes if said output wavelength of said optical source changes;

and wherein said source wavelength is kept constant by said applying of said feedback control signal to said optical source means.

* * * * *

UNITED STATES PATENT AND TRADEMARK OFFICE
CERTIFICATE OF CORRECTION

PATENT NO. : 5,040,896

DATED : August 20, 1991

INVENTOR(S) : Behzad Moslehi

It is certified that error appears in the above-identified patent and that said Letters Patent is hereby corrected as shown below:

ON TITLE PAGE: Item [73],
insert: --Assignee: Litton Systems, Inc.,
Woodland Hills, California--

Signed and Sealed this

Twenty-sixth Day of May, 1992

Attest:

DOUGLAS B. COMER

Attesting Officer

Acting Commissioner of Patents and Trademarks